United States Patent [19]

Endo et al.

[11] Patent Number: 4,880,661

[45] Date of Patent: Nov. 14, 1989

[54] METHOD OF MANUFACTURING A THIN-FILM ELECTROLUMINESCENT DISPLAY ELEMENT

[75] Inventors: Yoshihiro Endo, Nara; Masashi Kawaguchi, Shiki; Hiroshi Kishishita, Nara; Hisashi Uede, Wakayama, all of Japan

[73] Assignee: Sharp Kabushiki Kaisha, Osaka, Japan

[21] Appl. No.: 246,890

[22] Filed: Sep. 15, 1988

Related U.S. Application Data

[63] Continuation of Ser. No. 35,224, Apr. 6, 1987, abandoned, which is a continuation of Ser. No. 772,371, Sep. 9, 1985, abandoned.

[30] Foreign Application Priority Data

Sep. 17, 1984 [JP] Japan ................................ 59-195237

[51] Int. Cl.⁴ ......................... B05D 3/06; B05D 5/12; C23C 14/00

[52] U.S. Cl. ................................ 427/38; 204/192 D; 204/192.1; 427/39; 427/66

[58] Field of Search ............................ 427/38, 39, 66; 204/192 D

[56] References Cited

U.S. PATENT DOCUMENTS

| | | | |
|---|---|---|---|
| 4,188,565 | 2/1980 | Mizukami et al. | 313/509 |
| 4,481,229 | 11/1984 | Suzuki et al. | 427/38 |
| 4,492,716 | 1/1985 | Yamazaki | 427/38 |
| 4,496,450 | 1/1985 | Hitosuyanagi et al. | 427/38 |
| 4,517,733 | 5/1985 | Hamano | 427/38 |
| 4,525,381 | 6/1985 | Tanaka et al. | 427/38 |

*Primary Examiner*—Janyce Bell

*Attorney, Agent, or Firm*—Flehr, Hohbach, Test, Albritton & Herbert

[57] ABSTRACT

A thin-film EL element is manufactured by forming a silicon nitride or silicon oxynitride film for a first dielectric layer by sputtering and a silicon nitride or silicon oxynitride film for a second dielectric layer by plasma chemical vapor deposition so that the element's resistance against moisture and mass productivity can be improved.

3 Claims, 1 Drawing Sheet

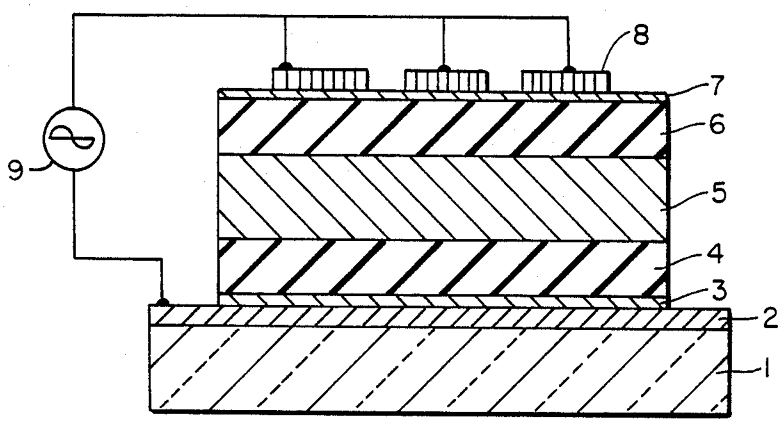
8
7
6
5
4
3
2
1
9

METHOD OF MANUFACTURING A THIN-FILM ELECTROLUMINESCENT DISPLAY ELEMENT

This is a continuation of application Ser. No. 035,224 filed Apr. 6, 1987 now abandoned which is a continuation of application Ser. No. 772,371 filed in Sept. 9, 1985 now abandoned.

This invention relates to a thin-film electroluminescent (EL) display element which emits light when an alternate current electric field is applied and in particular to a method of manufacturing a thin-film EL element with improved moisture-resistant property and stabilized emission characteristics.

As shown, for example, in U.S. Pat. No. 4,188,565 issued to Mizukami, et al. and assigned to the present assignee, the two dielectric layers of a conventional thin-film EL element are formed by using a sputtering technique. In the FIGURE which shows the general structure of an ordinary thin-film EL element, numerals 4 and 6 indicate respectively a first dielectric layer and a second dielectric layer of a silicon nitride or silicon oxynitride film. On one of the surfaces of each of these dielectric layers 4, 6, there is formed a metal oxide layer 3, 7 of alumina ($Al_2O_3$) or silicon oxide ($SiO_2$) to provide a composite dielectric-metal oxide film for the purposes of insulation, resistance against pressure, dielectric constant and emission characteristics. A ZnS film 5 as luminescent layer is sandwiched between the two dielectric layers 4, 6.

In the past, it was customary to form the first and second dielectric layers 4, 6 by using a sputtering technique. By such a method, a silicon target is used and the layers are formed by reactive sputtering in a $N_2$ atmosphere in the case of silicon nitride and in a $N_2+N_2O$ (or $O_2$) atmosphere in the case of silicon oxynitride. Use may also be made of a silicon nitride target.

In the step of forming the second dielectric layer by a sputtering method, however, there have been the following types of problems:

(1) small protrusions and foreign matters on the ZnS film are not covered well;

(2) the ZnS film is easily damaged by the incidence of secondary electrons at the time of sputtering, causing changes in the emission characteristics;

(3) the cost of equipment is high since the sputtering rate is low (200 A/min) and a high-level vacuum is necessary.

The first of the above allows moisture from outside to invade through the second dielectric layer to reach the boundary surface between the ZnS film and the silicon nitride (or silicon oxynitride) film, and this tends to cause separation between these layers when the element is driven. Thus, the problem of resistance against moisture was always present with the thin-film EL elements manufactured by the conventional sputtering method of forming the silicon nitride (or silicon oxynitride) film of the second dielectric layer.

It is therefore an object of this invention to eliminate the aforementioned problems associated with the conventional thin-film EL elements by providing a method of manufacturing a thin-film EL element which not only can improve the resistance against moisture and stabilize the emission characteristics of the element but also is suited for mass production.

Another object of this invention is to provide a method of manufacturing a thin-film EL element wherein the silicon nitride or silicon oxynitride film of the second dielectric layer of a thin-film EL element is formed by a plasma CVD (chemical vapor deposition) method.

A further object of this invention is to provide a method of manufacturing a thin-film EL element wherein the silicon nitride or silicon oxynitride film of the first dielectric layer is formed by a sputtering method and the silicon nitride or silicon oxynitride film of the second dielectric layer is formed by a plasma CVD method so as to improve the resistance against moisture and stability in emission characteristics of the element.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

According to one embodiment of the invention, a thin-film EL element is manufactured by forming the silicon nitride or silicon oxynitride film of the second dielectric layer by a plasma CVD method so that the moisture-resistance of the thin-film EL element and its mass productivity can be improved. According to another embodiment of the invention, a thin-film EL element is manufactured by forming the silicon nitride or silicon oxynitride film of the first dielectric layer by a sputtering method and the silicon nitride or silicon oxynitride film of the second dielectric layer by a plasma CVD method so that the moisture-resistance of the thin-film EL element and its mass productivity can be improved.

The present invention will be better understood from the detailed description given hereinbelow and the accompanying drawing which is given by way of illustration only, and thus is not limitative of the present invention in which:

The FIGURE is a cross sectional view of a thin-film EL element according to the present invention.

In what follows, a method of manufacturing a thin-film EL element according to one embodiment of the present invention will be explained with reference to the FIGURE.

Transparent electrodes 2 of indium tin oxide (ITO), etc. in stripes are formed by an etching method on a glass substrate 1. Next, a metal oxide film 3, for example, of $SiO_2$ is formed by a sputtering or vacuum vapor deposition method, and a silicon nitride or silicon oxynitride film 4 as a first dielectric layer is overlappingly formed thereon by a sputtering method. The thickness of the metal oxide film 3 is about 200–800 A and that of the first dielectric layer 4 is about 1000–3000 A. For the reason to be presented below, the plasma CVD method cannot be adopted for the first dielectric layer 4 and it is formed by a sputtering method.

Next, a luminescent layer 5 is formed to a thickness of about 6000–8000 A by using ZnS:Mn sintered pellets in an electron beam vapor deposition method and it is annealed in vacuum at about 500°–650° C. An active substance such as Mn is added to the luminescent layer so as to form a luminescent center in the ZnS layer.

According to the conventional method, a silicon nitride or silicon oxynitride film as a second dielectric layer would be formed on this ZnS luminescent layer 5 by sputtering. According to the present invention, by contrast, a second dielectric layer 6 of silicon nitride or silicon oxynitride film is formed by a plasma CVD method.

The advantage of the plasma CVD method over the sputtering method in this case is that the gas pressure is higher at the time of producing the film so that the film can be covered more completely and a film with internal stress in a compressive mode can be formed. This tends to reduce defects in the film and to prevent the invasion of moisture more effectively. For example, the gas pressure when a film is being formed is about $10^{-1}$–10 torr by the plasma CVD method but it is only about $10^{-3}$–$10^{2}$ torr by the sputtering method. Another advantage of the plasma CVD method is that there is no incidence of secondary electrons associated with the sputtering method so that the ZnS luminescent film 5 is not damaged and the deterioration of emission characteristics does not result. Even at low radio frequency power, the rate of film deposition can be high (about 300–500 A/min) and since high-level vacuum necessary for the sputtering method is not required, the cost of manufacturing apparatus can be low and the method is appropriate for mass production.

The conditions for the fabrication of the second dielectric layer by the plasma CVD method are as follows. If the second dielectric layer is a silicon nitride film, $SiH_4/NH_3/N_2$ is used as the reaction gas at about 0.2–1.0 torr and the substrate temperature is maintained at about 100°–300° C. If the substrate temperature is too high (over 300° C.), there does not result a uniform noncrystal film but crystalization takes place and the film becomes white. The deposition rate of the second dielectric layer under the aforementioned conditions is about 400 A/min. A rate in the range of about 300–500A/min is obtainable and the thickness of film is about 1000–2000 A.

If the second dielectric layer is a silicon oxynitride film, a film can be formed by adding $N_2O$ to the reaction gas for the case of silicon nitride. The other conditions are the same as in the case of silicon nitride. The rate of deposition and the film thickness are also about the same as in the case of silicon nitride.

Subsequent to the formation of the second dielectric layer 6, a metal oxide film 7 of $Al_2O_3$ or $SiO_2$ with thickness about 200–800 A is formed on this layer by sputtering, vacuum vapor deposition or plasma CVD. Next, a back electrode 8, for example, of Al is formed like stripes and the manufacturing of the thin-film EL element is completed. Numeral 9 indicates a driving power source. In the above, the metal oxide films 3 and 7 may be omitted in certain situations.

As described above, there are many advantages in using the plasma CVD method rather than the sputtering method to form a silicon nitride or silicon oxynitride film as the second dielectric layer. It has been discovered by the present inventors, however, that the plasma CVD method cannot be used advantageously for the formation of the first dielectric layer. This can be explained as follows.

When the plasma CVD method is used to form a silicon nitride or silicon oxynitride film, use is made of $SiH_4$ and $NH_3$ as reaction gas. Thus, a small amount (about 1–2 wt %) of hydrogen becomes present in the silicon nitride or silicon oxynitride film. After the vapor deposition of luminescent layer, on the other hand, the thin-film EL element must be annealed at about 500°–650° C. Thus, if the silicon nitride or silicon oxynitride film of the first dielectric layer is formed by the plasma CVD method, hydrogen contained therein is released during the annealing process and the transparent electrode of ITO, etc. becomes reduced. This not only makes the electrode black and causes a change in resistance but also affects the element's resistance against pressure adversely. In the case of the second dielectric layer, no annealing process is involved after the film is formed and there is no ill effect from hydrogen that is contained. It is preferable therefore to use the sputtering method for forming the silicon nitride or silicon oxynitride film for the first dielectric layer and the plasma CVD method for forming the silicon nitride or silicon oxynitride film for the second dielectric layer.

In summary, the method of the present invention is advantageous over the prior methods in the following respects:

(1) If the silicon nitride or silicon oxynitride film of the second dielectric layer is formed by the plasma CVD method, small protrusions and foreign matters on the ZnS film of the luminescent layer are covered better and hence the element's resistance improved against moisture;

(2) Deterioration in the emission characteristics due to damage to the ZnS film of the luminescent layer caused by the incidence of secondary electrons during the film formation can be eliminated;

(3) The deposition rate is high and mass productivity is improved.

While only certain embodiments of the present invention have been described, it will be apparent to those skilled in the art that various changes and modifications may be made therein without departing from the spirit and scope of the present invention as claimed. Such changes and modifications are intended to be within the scope of this invention.

What is claimed is:

1. A method of manufacturing a thin-film EL element comprising the steps of forming a first electrode, forming a first dielectric layer by sputtering, forming a luminescent layer, forming a second dielectric layer by plasma chemical vapor deposition, and forming a second electrode.

2. A method of manufacturing a thin-film EL element comprising the steps of forming a first electrode like stripes on a substrate, forming a first metal oxide film on said substrate having said first electrode, forming a first dielectric layer by sputtering on said first metal oxide film, forming a luminescent layer on said first dielectric layer, forming a second dielectric layer by plasma chemical vapor deposition on said luminescent layer, forming a second metal oxide film on said second dielectric layer, and forming a second electrode like stripes on said second metal oxide film.

3. The method of claim 1 wherein said first and second dielectric layers are each a silicon nitride or silicon oxynitride film.

* * * * *